(12) United States Patent
Onaka et al.

(10) Patent No.: US 12,057,617 B2
(45) Date of Patent: Aug. 6, 2024

(54) ANTENNA MODULE, CONNECTION MEMBER, AND COMMUNICATION DEVICE EQUIPPED WITH THE SAME

(71) Applicant: Murata Manufacturing Co., Ltd., Nagaokakyo (JP)

(72) Inventors: Kengo Onaka, Nagaokakyo (JP); Hirotsugu Mori, Nagaokakyo (JP); Yoshiki Yamada, Nagaokakyo (JP); Kaoru Sudo, Nagaokakyo (JP); Hiroshi Izumitani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 30 days.

(21) Appl. No.: 18/090,508

(22) Filed: Dec. 29, 2022

(65) Prior Publication Data
US 2023/0140655 A1    May 4, 2023

Related U.S. Application Data

(63) Continuation of application No. PCT/JP2021/013873, filed on Mar. 31, 2021.

(30) Foreign Application Priority Data

Jul. 2, 2020  (JP) ................................. 2020-114821
Oct. 14, 2020 (JP) ................................. 2020-173343

(51) Int. Cl.
*H01Q 1/22* (2006.01)
*H01Q 1/08* (2006.01)
(Continued)

(52) U.S. Cl.
CPC ........... *H01Q 1/2208* (2013.01); *H01Q 1/085* (2013.01); *H01Q 1/2283* (2013.01); *H01Q 1/422* (2013.01); *H01Q 5/335* (2015.01)

(58) Field of Classification Search
CPC .... H01Q 1/2208; H01Q 1/085; H01Q 1/2283; H01Q 1/422; H01Q 5/335; H01Q 1/243;
(Continued)

(56) References Cited

U.S. PATENT DOCUMENTS

2016/0028153 A1   1/2016 Li et al.
2016/0099738 A1   4/2016 Kodama
(Continued)

FOREIGN PATENT DOCUMENTS

JP   2000-221536 A   8/2000
JP   2004-95995 A    3/2004
(Continued)

OTHER PUBLICATIONS

International Search Report and Written Opinion mailed on Jun. 8, 2021, received for PCT Application PCT/JP2021/013873, filed on Mar. 31, 2021, 9 pages including English Translation.

*Primary Examiner* — Wilson Lee
(74) *Attorney, Agent, or Firm* — XSENSUS LLP

(57) ABSTRACT

An antenna module includes a first substrate, a second substrate, a connection member connected between the first substrate and the second substrate, and an FEM disposed on the connection member. A radiating element is disposed on the first substrate. An RFIC for supplying a radio frequency signal to the radiating element is disposed on the second substrate. The connection member transmits radio frequency signals between the RFIC and the radiating element. The FEM amplifies radio frequency signals transmitted between the RFIC and the radiating element. The FEM is disposed at a position between a connecting point with the first substrate and a connecting point with the second substrate on the connection member.

20 Claims, 18 Drawing Sheets

(51) Int. Cl.
*H01Q 1/42* (2006.01)
*H01Q 5/335* (2015.01)

(58) Field of Classification Search
CPC ...... H01Q 21/0075; H01Q 23/00; H01Q 1/38; H04B 1/38; H05K 1/14
See application file for complete search history.

(56) References Cited

U.S. PATENT DOCUMENTS

| | | | |
|---|---|---|---|
| 2018/0241123 A1* | 8/2018 | Ahn | H01Q 1/38 |
| 2019/0356041 A1* | 11/2019 | Wang | H01Q 9/42 |
| 2020/0388913 A1* | 12/2020 | Chai | G06F 3/04164 |
| 2021/0313695 A1* | 10/2021 | Zhao | H01Q 21/28 |
| 2021/0399429 A1* | 12/2021 | Garrido Lopez | H01Q 1/44 |
| 2023/0009333 A1* | 1/2023 | Yun | H04B 7/0413 |

FOREIGN PATENT DOCUMENTS

| | | |
|---|---|---|
| JP | 2006-340367 A | 12/2006 |
| JP | 2012-238903 A | 12/2012 |
| JP | 2020-47688 A | 3/2020 |
| KR | 2019-0123122 A | 10/2019 |
| WO | 2018/186226 A1 | 10/2018 |

\* cited by examiner

ANTENNA MODULE, CONNECTION MEMBER, AND COMMUNICATION DEVICE EQUIPPED WITH THE SAME

CROSS-REFERENCE TO RELATED APPLICATIONS

The present application is a continuation of International Patent Application No. PCT/JP2021/013873, filed Mar. 31, 2021, which claims priority to Japanese Application No. 2020-114821, filed Jul. 2, 2020, and Japanese Application No. 2020-173343, filed Oct. 14, 2020, the entire contents of each of which being incorporated herein by reference in their entirety.

TECHNICAL FIELD

The present disclosure relates to an antenna module, a connection member, and a communication device equipped with the same, more specifically, relates to a technique for improving a degree of freedom in arrangement of an antenna module in a communication device.

BACKGROUND ART

An antenna module for transmitting and receiving radio waves is generally used in a mobile communication device represented by a mobile phone or a smartphone. In such mobile communication devices, there is still a high need for reduction in size and thickness, and accordingly, there is a demand for further reduction in size and height of devices such as antenna modules mounted in the devices.

In recent years, as a display region (display) of a communication device is enlarged, a position where a radiating element (antenna element) can be arranged in the communication device may be greatly limited. In this case, it may be difficult to dispose the antenna element close to a motherboard on which a circuit (IC: Integrated Circuit) for processing a radio frequency signal is disposed, or a situation may arise in which the arrangement of the circuit on the motherboard is limited.

In response to such a problem, for example, Japanese Unexamined Patent Application Publication No. 2020-47688 (Patent Document 1) discloses a configuration of a multilayer circuit board in which a multilayer substrate including a wiring portion having flexibility and a ceramic multilayer substrate on which an antenna element is disposed are integrated. In the multilayer circuit board disclosed in Japanese Unexamined Patent Application Publication No. 2020-47688 (Patent Document 1), an IC for a radio frequency signal is disposed in the wiring portion of the multilayer substrate, and the wiring portion is connected to a motherboard, thereby increasing the degree of freedom in arrangement of the antenna element.

CITATION LIST

Patent Document

Patent Document 1: Japanese Unexamined Patent Application Publication No. 2020-47688

SUMMARY

Technical Problems

On the other hand, in the configuration of Japanese Unexamined Patent Application Publication No. 2020-47688 (Patent Document 1), when the length of the wiring portion is increased, a radio frequency signal is attenuated due to an increase in loss in the wiring portion, and there is a possibility that antenna characteristics are deteriorated such as insufficient power of radiating radio waves or deterioration in quality of a reception signal.

The present disclosure has been made to solve the above-described problem, as well as other problems, and an object of the present disclosure is to improve the degree of freedom of layout in a communication device while suppressing deterioration of antenna characteristics in an antenna module.

Solutions to Problems

An antenna module according to an aspect of the present disclosure includes a first substrate, a second substrate, a connection member connected between the first substrate and the second substrate, and an amplifier circuit disposed on the connection member. A radiating element is disposed on the first substrate. A feed circuit that supplies a radio frequency signal to the radiating element is disposed on the second substrate. The connection member transmits a radio frequency signal between the feed circuit and the radiating element. The amplifier circuit amplifies a radio frequency signal transmitted between the feed circuit and the radiating element. The amplifier circuit is disposed at a position between a connecting point with the first substrate and a connecting point with the second substrate in the connection member.

A connection member according to another aspect of the present disclosure relates to a connection member for connecting a first substrate and a second substrate included in an antenna module. The connection member includes a third substrate and an amplifier circuit. A radiating element is disposed on the first substrate. A feed circuit for supplying a radio frequency signal to the radiating element is disposed on the second substrate. The third substrate transmits a radio frequency signal between the feed circuit and the radiating element. The amplifier circuit amplifies a radio frequency signal transmitted between the feed circuit and the radiating element. The amplifier circuit is disposed at a position between a connecting point with the first substrate and a connecting point with the second substrate in the third substrate.

Advantageous Effects of Disclosure

In the antenna module according to the present disclosure, the first substrate on which the radiating element is disposed and the second substrate on which the feed circuit is disposed are connected to each other by the connection member, and the amplifier circuit is disposed at a position between a connecting point with the first substrate and a connecting point with the second substrate in the connection member. With such a configuration, the second substrate (motherboard) on which the feed circuit is disposed and the radiating element can be disposed separately from each other, and thus the degree of freedom in arrangement of the radiating element in the device can be increased. Further, by disposing the amplifier circuit on the connection member, it is possible to reduce a loss caused by extension of a signal transmission distance between the feed circuit and the radiating element. Therefore, in the antenna module, it is possible to improve the degree of freedom of layout in the communication device while suppressing deterioration of antenna characteristics.

DESCRIPTION OF EMBODIMENTS

Figure 1:
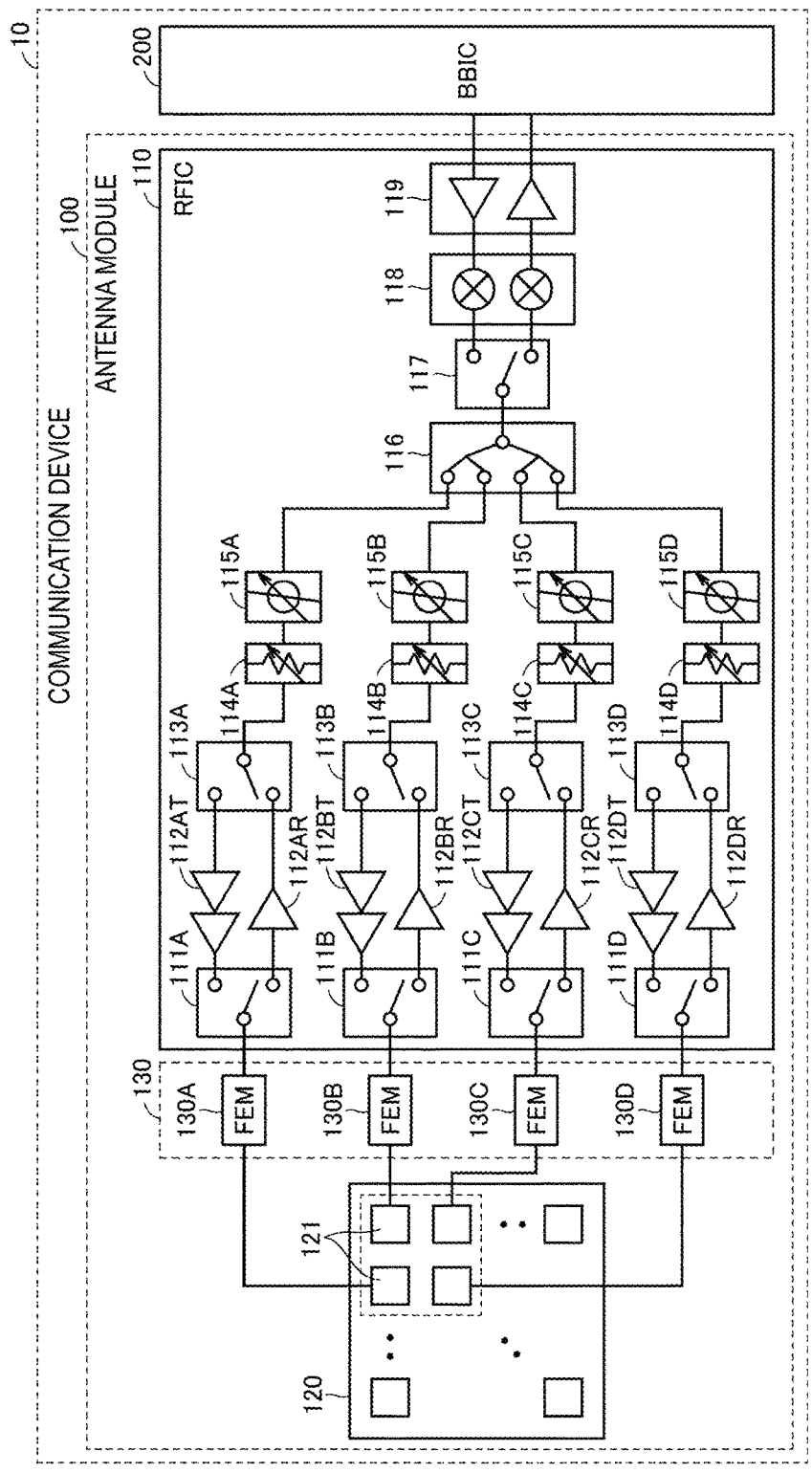
FIG. 1 is a block diagram of a communication device to which an antenna module according to Embodiment 1 is applied.

Hereinafter, embodiments of the present disclosure will be described in detail with reference to the drawings. Note that the same or corresponding portions in the drawings are denoted by the same reference numerals, and description thereof will not be repeated.

Embodiment 1

(Basic Configuration of Communication Device)

FIG. 1 is an example of a block diagram of a communication device 10 to which an antenna module 100 according to Embodiment 1 is applied. The communication device 10 is, for example, a mobile terminal such as a mobile phone, a smartphone, or a tablet, a personal computer having a communication function, a base station, or the like. An example of the band of frequencies of radio waves used in the antenna module 100 according to the present embodiment is radio waves in a millimeter wave band with the center frequency of, for example, 28 GHz, 39 GHz, 60 GHz, and the like, but radio waves in the frequency bands other than described above may be used.

Referring to FIG. 1, the communication device 10 includes the antenna module 100 and a BBIC 200 constituting a baseband signal processing circuit. The antenna module 100 includes an RFIC 110 which is an example of a feed circuit, an antenna device 120, and a front end module (hereinafter also referred to as "FEM") 130. The communication device 10 up-converts a signal transmitted from the BBIC 200 to the antenna module 100 into a radio frequency signal and radiates the radio frequency signal from the antenna device 120, and down-converts a radio frequency signal received by the antenna device 120 and processes the signal in the BBIC 200.

In FIG. 1, for ease of description, only configurations corresponding to four feed elements 121 among a plurality of feed elements 121 (also referred to herein as "radiating elements"). Moreover, the feed/radiating elements include structures that not only launch electrical current/voltage signals into a wireless propagation medium as electromagnetic waves, but also transduce electromagnetic waves that interact with radiating elements into current/voltage receive signals. The feed elements 121 constituting the antenna device 120 are illustrated, and configurations corresponding to the other feed elements 121 having the same configuration are omitted. Note that although FIG. 1 illustrates an example in which the antenna device 120 is formed by the plurality of feed elements 121 arranged in a two-dimensional array, the number of feed elements 121 is not necessarily plural, and the antenna device 120 may be formed by one feed element 121.

Alternatively, a one-dimensional array in which the plurality of feed elements 121 is arranged in line may be used. In the present embodiment, the feed element 121 is a patch antenna having a flat plate shape.

The RFIC 110 includes switches 111A to 111D, 113A to 113D, and 117, power amplifiers 112AT to 112DT, low noise amplifiers 112AR to 112DR, attenuators 114A to 114D, phase shifters 115A to 115D, a signal combiner/splitter 116, a mixer 118, and an amplifier circuit 119.

Under a condition a radio frequency signal is transmitted, the switches 111A to 111D and 113A to 113D are controlled to be switched to the power amplifiers 112AT to 112DT side, and the switch 117 is connected to a transmission-side amplifier of the amplifier circuit 119. Under a condition a radio frequency signal is received, the switches 111A to 111D and 113A to 113D are controlled to be switched to the low noise amplifiers 112AR to 112DR side, and the switch 117 is connected to a reception-side amplifier of the amplifier circuit 119.

The signal transmitted from the BBIC 200 is amplified by the amplifier circuit 119 and up-converted by the mixer 118. A transmission signal, which is the up-converted radio frequency signal, is divided into four signals by the signal combiner/splitter 116. Each of the four signals passes through respective four signal paths, and is fed to different feed elements 121, respectively. At this time, it is possible to adjust the directivity of the antenna device 120 by individually adjusting phase shift degree of the phase shifters 115A to 115D arranged in the respective signal paths.

Reception signals, which are radio frequency signals received by the feed elements 121, respectively pass through four different signal paths, and are combined by the signal combiner/splitter 116. The combined reception signal is down-converted by the mixer 118, amplified by the amplifier circuit 119, and transmitted to the BBIC 200.

The RFIC 110 is formed as a one chip integrated circuit component including the above-described circuit configuration, for example. Alternatively, the devices (switches, power amplifiers, low noise amplifiers, attenuators, and phase shifters) corresponding to the feed elements 121 in the RFIC 110 may be formed as a one chip integrated circuit component for each of the corresponding feed elements 121.

The FEM 130 includes FEMs 130A to 130D. The FEMs 130A to 130D are connected to the switches 111A to 111D in the RFIC 110, respectively.

Figure 2:
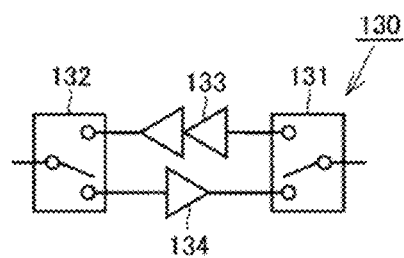
FIG. 2 is a diagram illustrating detail of a front end module in FIG. 1.

As illustrated in FIG. 2, each of the FEMs 130A to 130D includes switches 131 and 132, a power amplifier 133, and a low noise amplifier 134. In the FEM 130, the switches 131 and 132 are switched to the power amplifier 133 side when transmitting a radio frequency signal, and the switches 131 and 132 are switched to the low noise amplifier 134 side when receiving a radio frequency signal, similar to the switches 111A to 111D and 113A to 113D, the power amplifiers 112AT to 112DT, and the low noise amplifiers 112AR to 112DR provided inside the RFIC 110.

As described above, the FEMs 130A to 130D are amplifier circuits, which amplify a radio frequency signal transmitted between the RFIC 110 and the antenna device 120 to compensate for attenuation occurring between the RFIC 110 and the antenna device 120. In particular, it is effective under a condition the length of a signal transmission path from the RFIC 110 to the antenna device 120 is relatively long and an amplification factor is insufficient in the power amplifier and the low noise amplifier in the RFIC 110. Note that although the case where the FEM 130 includes both the power amplifier 133 and the low noise amplifier 134 has been described in FIG. 2, the FEM 130 only needs to include at least one of the power amplifier 133 and the low noise amplifier 134, and may include either the power amplifier 133 or the low noise amplifier 134.

(Configuration of Antenna Module)

Figure 3:
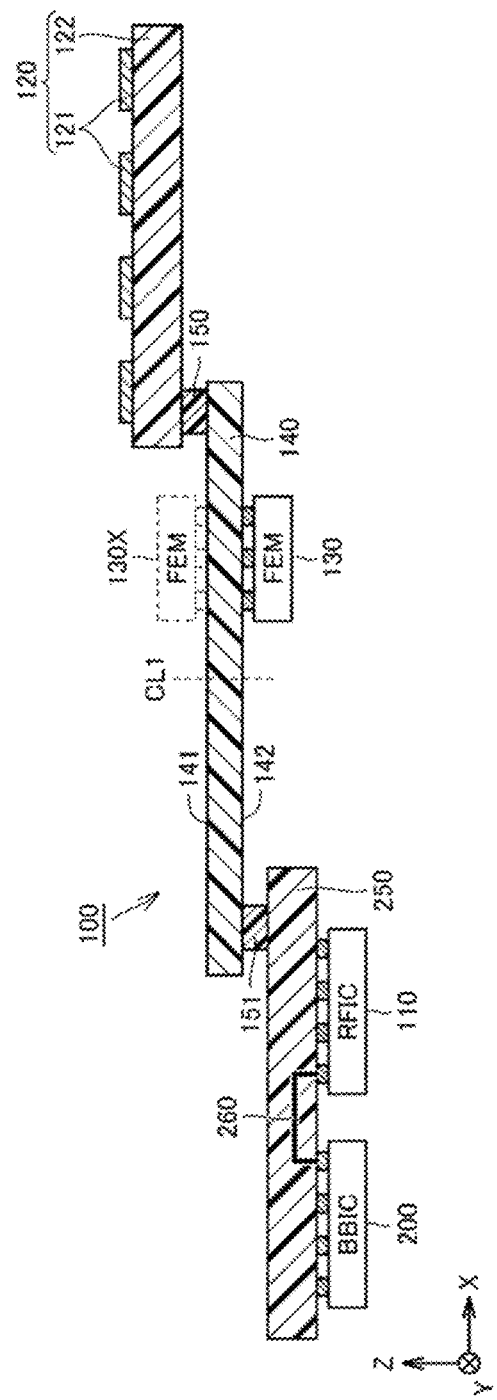
FIG. 3 is a side view of the antenna module according to Embodiment 1.

FIG. 3 is a side view of the antenna module 100 according to Embodiment 1. The antenna module 100 includes the RFIC 110, the antenna device 120 in which the feed element 121 is formed on a dielectric substrate 122, the FEM 130, and a connection member 140. The RFIC 110 is disposed on a motherboard 250, and is electrically connected to the BBIC 200 disposed on the motherboard 250 by a connection wiring 260. Note that the "dielectric substrate 122" and the "motherboard 250" in Embodiment 1 correspond to a "first substrate" and a "second substrate" in the present disclosure, respectively. Note that in FIG. 3 and the following description, a normal direction of the motherboard 250 is referred to as a Z-axis direction, and directions orthogonal to the Z-axis direction (in-plane directions of the motherboard 250) are referred to as an X-axis direction and a Y-axis direction.

The dielectric substrate 122 on which the feed element 121 is formed in the antenna device 120 is, for example, a low temperature co-fired ceramics (LTCC) multilayer substrate, a multilayer resin substrate formed by laminating a plurality of resin layers made of a resin such as epoxy or polyimide, a multilayer resin substrate formed by laminating a plurality of resin layers made of liquid crystal polymer (LCP) having a lower dielectric constant, a multilayer resin substrate formed by laminating a plurality of resin layers made of fluororesin, a multilayer resin substrate formed by laminating a plurality of resin layers made of polyethylene terephthalate (PET) material, or a ceramics multilayer substrate other than LTCC. Note that the dielectric substrate 122 does not necessarily have a multilayer structure, and may be a single-layer substrate. Alternatively, the dielectric substrate 122 may be a housing of the communication device 10.

The feed element 121 has a flat plate shape and is formed of a conductor such as copper or aluminum. The shape of the feed element 121 is not limited to a rectangle as illustrated in FIG. 1, but may be a polygon, a circle, an ellipse, or a cross shape. The feed element 121 is formed on a surface of the dielectric substrate 122 or in an internal layer. Although an array antenna in which the four feed elements 121 are arranged in one direction is illustrated in the example of FIG. 3, the configuration may be adopted in which the feed element 121 is singly used, or a plurality of feed elements is arranged one dimensionally or two dimensionally. Note that although not illustrated in FIG. 3, a ground electrode is disposed on the dielectric substrate 122 so as to face the feed element 121.

The connection member 140 is a member for transmitting a radio frequency signal from the RFIC 110 disposed on the motherboard 250 to the antenna device 120, and as will be described later with reference to FIG. 4, has a plurality of feed wirings formed therein. The connection member 140 is used as a signal transmission path under a condition the antenna device 120 is disposed at a position away from the motherboard 250 in the communication device 10.

Similar to the dielectric substrate 122, the connection member 140 has a dielectric substrate 143 (FIG. 4) formed of a ceramics such as LTCC or a resin. The dielectric substrate 143 has a multilayer structure in which a plurality of dielectric layers is laminated. The connection member 140 may be formed of a rigid material that does not deform, or may be formed of a flexible material as described later with reference to FIG. 7 to FIG. 9. Note that the "dielectric substrate 143" corresponds to a "third substrate" of the present disclosure.

The connection member 140 is connected to the antenna device 120 by a connection terminal 150 on a front surface 141 of the connection member 140. In addition, the connection member 140 is connected to the motherboard 250 by a connection terminal 151 on a back surface 142 of the connection member 140. The connection terminals 150 and 151 are configured to be, for example, a detachable connector. Note that the connection terminals 150 and 151 may be formed by a solder bump.

In the connection member 140, the FEM 130 is disposed at a position between a connecting point (i.e., the connection terminal 150) with the dielectric substrate 122 of the antenna device 120 and a connecting point (i.e., the connection terminal 151) with the motherboard 250. More specifically, the FEM 130 is disposed at a position closer to the antenna device 120 than the motherboard 250 in the signal transmission path of the connection member 140. In other words, the FEM 130 is disposed closer to the connection terminal 150 than a middle point (a broken line CL1 in FIG. 3) of a path connecting the connection terminal 150 and the connection terminal 151. The FEM 130 is disposed at a position that does not overlap the feed element 121 formed in the antenna device 120 in a plan view from the normal direction (Z-axis direction) of the antenna device 120.

The FEM 130 may be directly connected to the connection member 140 using a solder bump, a connector, or the like, or may be connected via an intermediate substrate such as an interposer. Further, in order to reduce the height, a portion where the FEM 130 is disposed in the connection member 140 may be thinner than the other portions. Note that although FIG. 3 illustrates an example in which the FEM 130 is disposed on the back surface 142 of the connection member 140, the FEM 130 may be disposed on the front surface 141 of the connection member 140 as an FEM 130X indicated by a broken line.

Figure 4:
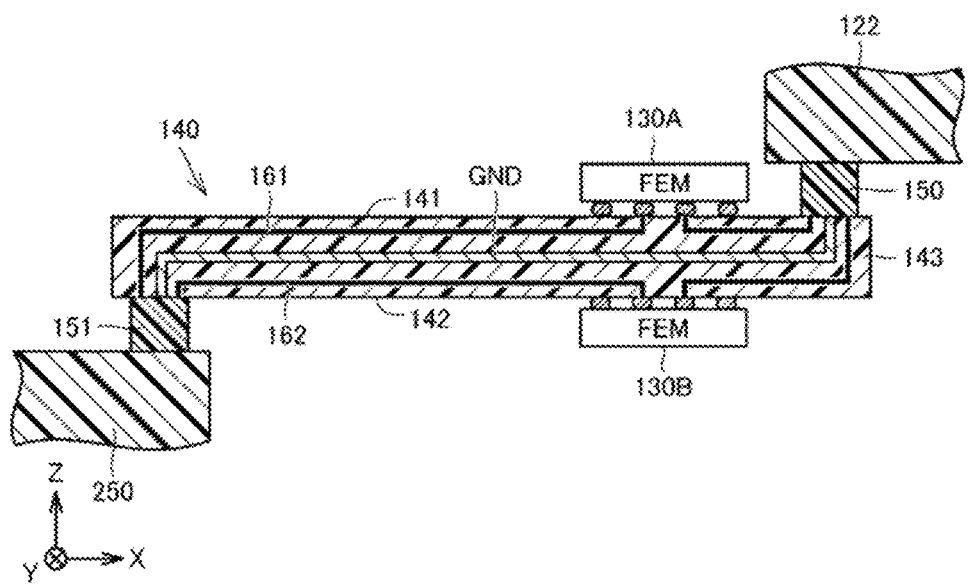
FIG. 4 is a view illustrating an example of an internal structure of a connection member.

FIG. 4 is a view illustrating an example of an internal structure of the connection member 140. In the example of FIG. 4, the FEM 130A (first amplifier) is disposed on the front surface (first surface) 141 of the connection member 140, and the FEM 130B (second amplifier) is disposed on the back surface (second surface) 142 of the connection member 140. In the connection member 140, feed wirings 161 and 162 and a ground electrode GND of the signal transmission path are formed. The feed wiring 161 (first wiring) transmits a radio frequency signal to the feed element 121 of the antenna device 120 via the FEM 130A. The FEM 130A amplifies the radio frequency signal transmitted via the feed wiring 161. In addition, the feed wiring 162 (second wiring) transmits a radio frequency signal to another feed element 121 via the FEM 130B. The FEM 130B amplifies the radio frequency signal transmitted via the feed wiring 162.

The feed wiring 161 and the feed wiring 162 are formed in layers different from each other in the dielectric substrate 143. The ground electrode GND is formed between the layer in which the feed wiring 161 is formed and the layer in which the feed wiring 162 is formed, and is connected to a reference potential (not illustrated) formed on the motherboard 250 via the connection terminal 151. In addition, the ground electrode GND is connected to a ground electrode (not illustrated) formed on the dielectric substrate 122 of the antenna device 120 via the connection terminal 150. By arranging the feed wirings 161 and 162 with the ground electrode GND interposed therebetween, it is possible to ensure isolation between the feed wiring 161 and the feed wiring 162.

As described in FIG. 2, the FEM 130 is an amplifier circuit including the power amplifier 133 and/or the low noise amplifier 134. In a case where the connection member 140 is used, a distance between the RFIC 110 and the antenna device 120 is long as compared with a case where the connection member 140 is not used, and thus the attenuation due to the signal transmission path may increase and the loss may increase. Therefore, the FEM 130 is disposed in the connection member 140, and a transmission signal from the RFIC 110 to the antenna device 120 and/or a reception signal received by the antenna device 120 are/is amplified to thereby compensate for the loss in the connection member 140. As a result, it is possible to realize radiation of radio waves with desired power and/or suppression of deterioration in quality of a reception signal.

Here, the signal received by the antenna device 120 is generally attenuated while being transmitted by radio waves, so that a signal level is lowered, and further, a noise component is superimposed on the signal to be transmitted. As described above, even while the signal is transmitted through the connection member 140, the signal is further attenuated by the impedance of the signal transmission path of the connection member 140. Further, since the transmission signal is also amplified by the amplifier included in the RFIC 110, the signal level of the reception signal may be lower than that of the transmission signal. In general, since a reception signal has a lower signal to noise ratio than a transmission signal and is more affected by noise, a noise figure (NF) is likely to deteriorate due to a loss occurring in the connection member 140. Therefore, it is can be beneficial to amplify the reception signal as soon as possible.

In the antenna module 100 according to Embodiment 1, as described above, the FEM 130 is disposed at a position closer to the antenna device 120 than to the motherboard 250 in the connection member 140. Therefore, the amplification of the reception signal is preferentially executed over the amplification of the transmission signal. As a result, it is possible to suppress the deterioration in the quality of the reception signal.

Embodiment 2

In Embodiment 2, an arrangement configuration in consideration of heat dissipation of the front end module will be described.

As described above, the FEM 130 may include the power amplifier 133 for amplifying a transmission signal. In order to radiate a radio wave to a distance, power (electric power) corresponding to the radio wave is required, and thus, in general, the power amplifier for a transmission signal consumes more electric power at the time of amplification than the low noise amplifier 134 that amplifies a reception signal. Therefore, in an antenna module that requires particularly high transmission power, an influence of heat generation at the FEM 130 becomes large.

In the communication device 10, since the motherboard 250 has a larger physical area than the antenna device 120, the heat dissipation efficiency of the motherboard is higher than that of the antenna device 120. Therefore, in Embodiment 2, the FEM 130 disposed on the connection member 140 is disposed closer to the motherboard 250 than to the antenna device 120. This facilitates the transfer of heat generated by the FEM 130 to the motherboard 250. As a result, it is possible to prevent the temperature of the FEM 130 from becoming high and to reduce a thermal influence on the internal circuit and the surrounding devices and members.

Figure 5:
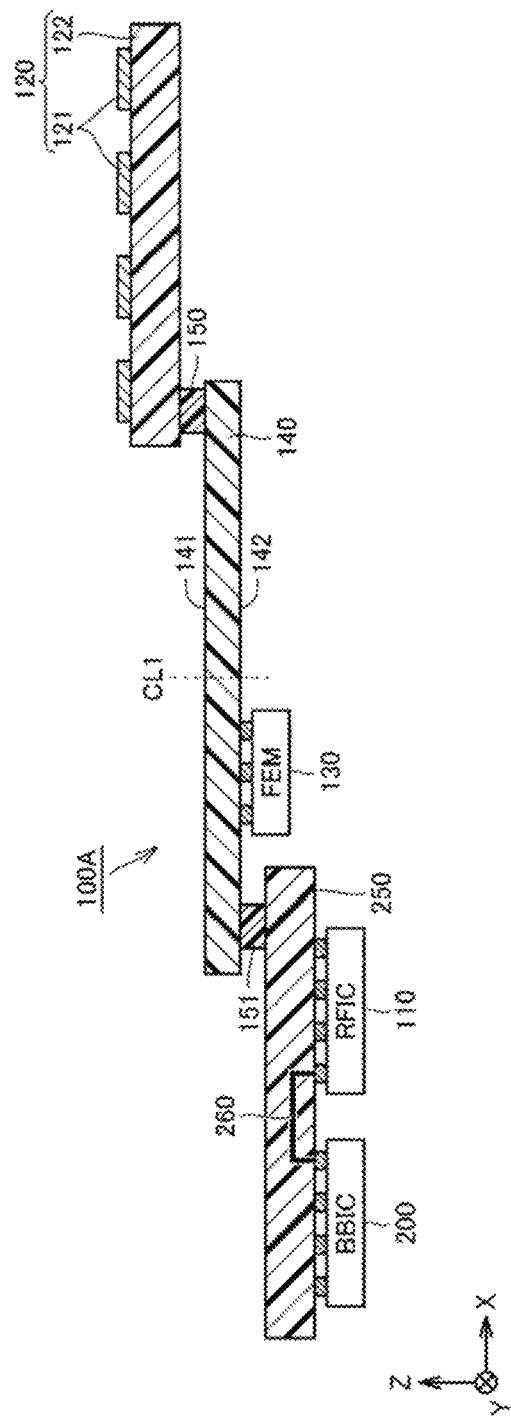
FIG. 5 is a side view of an antenna module according to Embodiment 2.

FIG. 5 is a side view of an antenna module 100A according to Embodiment 2. In the antenna module 100A of FIG. 5, the position of the FEM 130 on the connection member 140 is different from that of the antenna module 100 of Embodiment 1. Note that in the antenna module 100A, description of the same elements as those of the antenna module 100 of FIG. 3 will not be repeated.

To be specific, the FEM 130 is disposed at a position closer to the motherboard 250 than to the antenna device 120 in the signal transmission path of the connection member 140. In other words, the FEM 130 is disposed closer to the connection terminal 151 than the middle point (the broken line CL1 in FIG. 5) of the path connecting the connection terminal 150 and the connection terminal 151. With such an arrangement, the heat generated in the FEM 130 is more easily transferred to the motherboard 250 through the dielectric forming the connection member 140 and the conductors such as the feed wirings 161 and 162 and the ground electrode GND inside the connection member 140, as compared with the arrangement of the antenna module 100 of Embodiment 1. Therefore, it is possible to reduce the influence of heat generation of the FEM 130.

On the other hand, as described in Embodiment 1, it is not preferable to dispose the FEM 130 near the motherboard 250 in the connection member 140 from the viewpoint of the loss of the transmission power and the deterioration of the noise figure (NF). That is, with respect to the installation position of the FEM 130 in the connection member 140, there is a trade-off relationship between the loss reduction and the heat dissipation efficiency. Therefore, the position of the FEM 130 in the connection member 140 is determined in consideration of the degree of heat generation in the FEM 130 and the required antenna characteristics.

(Modification 1)

In Modification 1, an arrangement for more efficiently radiating heat from the front end module will be described.

Figure 6:
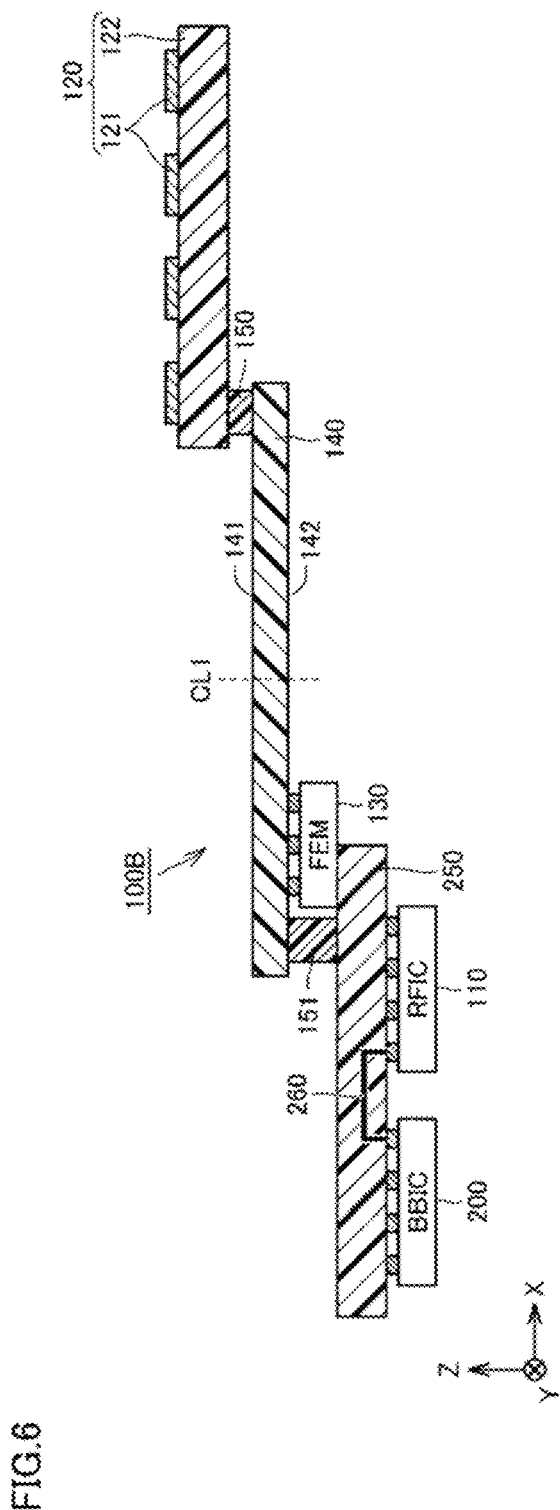
FIG. 6 is a side view of an antenna module according to Modification 1.

FIG. 6 is a side view of an antenna module 100B according to Modification 1. In the antenna module 100B, similar to the antenna module 100A of Embodiment 2, the FEM 130 is disposed on the side close to the motherboard 250 in the connection member 140, and further, at least a part of the FEM 130 is in contact with the motherboard 250. More specifically, when viewed from the normal direction of the motherboard 250 in a plan view, an end portion of the connection member 140 and an end portion of the motherboard 250 overlap each other, and the FEM 130 is in contact with the motherboard 250 on a surface opposite to a surface of the FEM 130 mounted on the connection member 140.

With such a configuration, the heat generated in the FEM 130 can be directly transferred to the motherboard 250, thereby further improving the heat dissipation efficiency. Note that the housing of the FEM 130 may be in direct contact with the motherboard 250, or a member having high heat-transfer efficiency (for example, a metal such as copper) may be disposed between the FEM 130 and the motherboard 250 to be in contact with each other.

Embodiment 3

In Embodiment 3, a case where a flexible connection member is used will be described.

Figure 7:
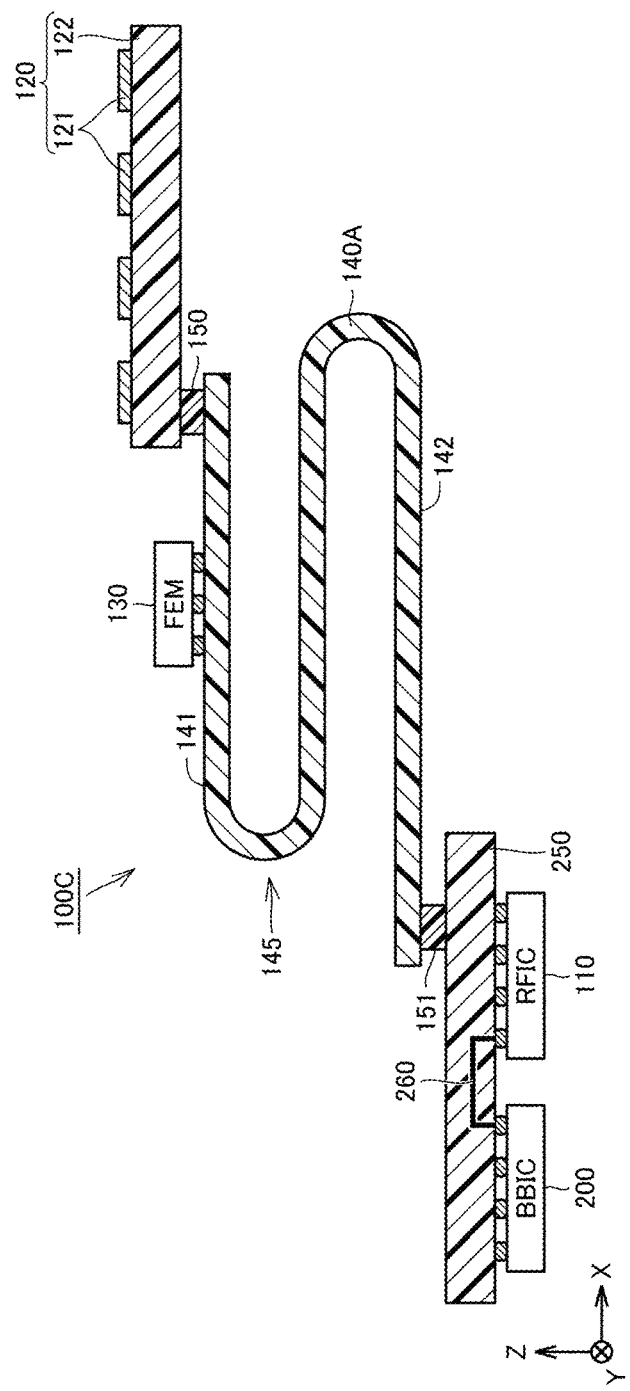
FIG. 7 is a side view of an antenna module according to Embodiment 3.

FIG. 7 is a side view of an antenna module 100C according to Embodiment 3. In the antenna module 100C, the connection member 140 of the antenna module 100 illustrated in FIG. 3 is replaced with a connection member 140A. Note that in the antenna module 100C, the description of the same elements as those of the antenna module 100 will not be repeated.

Referring to FIG. 7, the connection member 140A is a flexible substrate formed of a material having flexibility, and is configured to be bendable in a thickness direction. Similar to the antenna module 100, the connection member 140A is connected to the antenna device 120 at one end portion thereof by the connection terminal 150, and is connected to the motherboard 250 at the other end portion thereof by the connection terminal 151. Note that the connection terminal 150 for connecting to the antenna device 120 is disposed on the front surface 141 of the connection member 140A in FIG. 7, but may be disposed on the back surface 142 of the connection member 140A depending on the bending state of the connection member 140A.

At least one bent portion 145 is formed in the connection member 140A, and the FEM 130 is disposed between the bent portion 145 and the connection terminal 150 on the antenna device 120 side. Note that the FEM 130 is disposed on the front surface 141 and/or the back surface 142 according to the bending state and the number of bending times of the connection member 140A.

By using such a flexible connection member 140A, the normal direction of the antenna device 120 (i.e., a radiation direction of radio waves) can be made different from the normal direction of the motherboard 250, so that the degree of freedom of layout of the motherboard 250 and the antenna device 120 in the housing of the communication device 10 can be improved.

Then, by disposing the FEM 130 on the connection member 140A, it is possible to reduce the loss of the radio frequency signal caused by the extension of the signal transmission path due to the use of the connection member 140A and to suppress deterioration of antenna characteristics.

(Modification 2)

In Embodiment 3 of FIG. 7, an example of a configuration in which the connection member is bent in the thickness direction has been described. In Modification 2, a configuration in which the connection member is bent in an in-plane direction of a main surface will be described.

Figure 8:
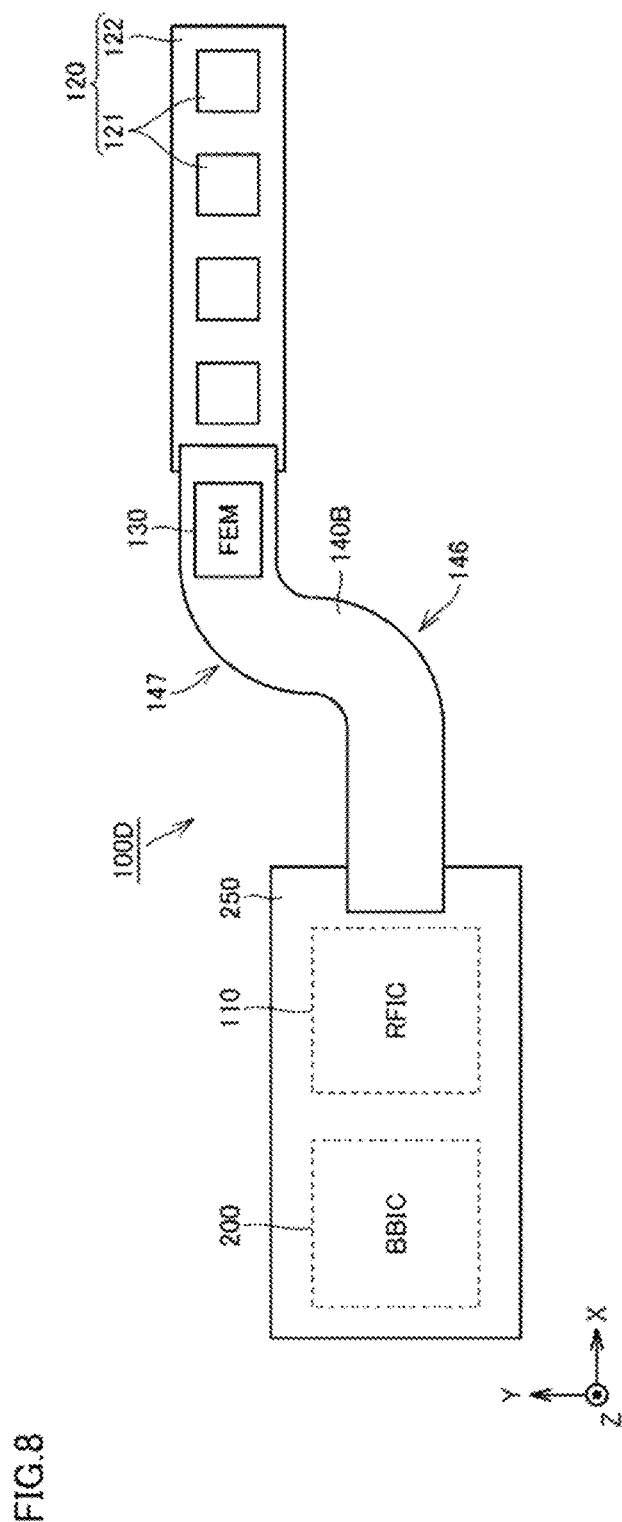
FIG. 8 is a plan view of an antenna module according to Modification 2.

FIG. 8 is a plan view of an antenna module 100D according to Modification 2. In the antenna module 100D, the connection member 140 of the antenna module 100 illustrated in FIG. 3 is replaced with a connection member 140B. Note that in the antenna module 100D, the description of the same elements as those of the antenna module 100 will not be repeated.

Referring to FIG. 8, the connection member 140B is a flexible substrate formed of a material having flexibility, and is configured to be bendable in the in-plane direction of the main surface (that is, in an XY plane). In the example of FIG. 8, the connection member 140B extends along the X-axis direction from a portion connected to the motherboard 250, is bent in the Y-axis direction at a bent portion 146, is bent again in the X-axis direction at a bent portion 147, and is connected to the antenna device 120. Note that the connection member 140B may be configured to be bendable also in the thickness direction as in Embodiment 3. In addition, the connection member 140B may be configured to be bendable in a twisting direction around the axis in an extending direction. The FEM 130 is disposed on a front surface and/or a back surface of the connection member 140B.

By using the connection member 140B like this, it is possible to improve the degree of freedom of layout of the antenna device 120 in the housing of the communication device 10. Further, by disposing the FEM 130 on the connection member 140B, it is possible to suppress deterioration of antenna characteristics due to the extension of the signal transmission path.

(Modification 3)

In Modification 3, an arrangement example in a communication device in the case where a flexible connection member is used will be described.

Figure 9:
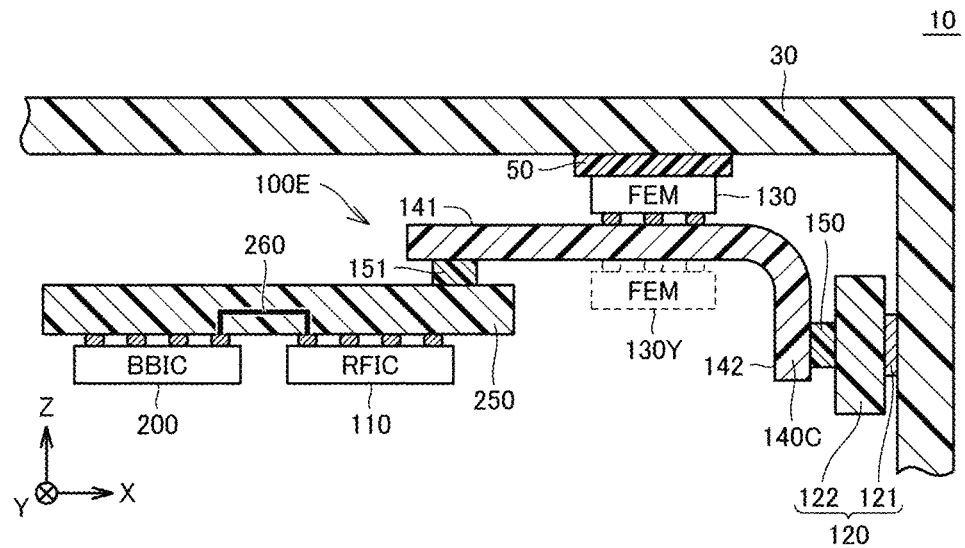
FIG. 9 is a view illustrating an arrangement example of an antenna module according to Modification 3 in the communication device.

FIG. 9 is a view illustrating an arrangement example of an antenna module 100E according to Modification 3 in the communication device 10. In the antenna module 100E illustrated in FIG. 9, a connection member 140C bendable in the thickness direction is used similar to the connection member 140A described with reference to FIG. 7. The connection member 140C is bent so as to have a substantially L-shaped cross section. The connection member 140C is connected to the antenna device 120 at one end portion thereof by the connection terminal 150, and is connected to the motherboard 250 at the other end portion thereof by the connection terminal 151.

Note that in the antenna device 120 of FIG. 9, the plurality of feed elements 121 is arranged along the Y-axis, and is attached to the dielectric portion of a housing 30 of the communication device 10. Thus, radio waves are radiated in the X-axis direction.

The FEM 130 is disposed on the front surface 141 of the connection member 140C. As described in Embodiment 2, the FEM 130 generates heat by the power amplifier formed therein. Therefore, the FEM 130 is disposed at a position separated from the housing 30. Accordingly, it is possible to prevent heat from the FEM 130 from being transferred to the housing 30 and prevent the temperature of the housing from locally increasing. Note that a heat insulating member 50 may be disposed between the FEM 130 and the housing 30.

Further, as an FEM 130Y indicated by a broken line, it may be disposed on the back surface 142 side of the connection member 140C. In this case, since the connection member 140C is disposed between the FEM 130Y and the housing 30, heat generated in the FEM 130Y is less likely to be transferred to the housing 30.

As described above, also in the antenna module 100E according to Modification 3, the degree of freedom of the layout of the antenna device 120 in the housing can be improved by using the connection member 140C having flexibility. In addition, by arranging the FEM 130 on the connection member 140C to be separated from the housing 30, it is possible to suppress deterioration of antenna characteristics due to the use of the connection member 140C and to suppress heat transfer from the FEM 130 to the housing 30.

Figure 10:
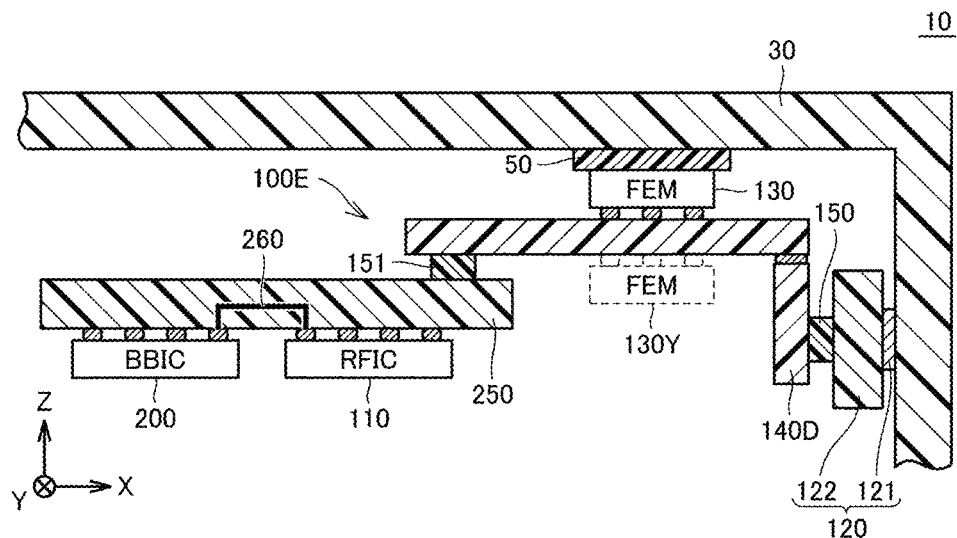
FIG. 10 is a view illustrating another arrangement example of the antenna module in the communication device.

Note that although the case where the connection member 140C is a flexible substrate having flexibility has been described with reference to FIG. 9, two rigid substrates may be connected by bonding or soldering to form a substantially L-shaped connection member 140D as illustrated in FIG. 10.

<Modification of Connection Terminal>

In the above-described embodiment, an example has been described in which the connection terminal 150 used for connection between the connection member and the antenna device and the connection terminal 151 used for connection between the motherboard and the connection member are formed between mutually facing surfaces of members to be connected. However, the connection terminals 150 and 151 may have another connection mode.

Figure 11:
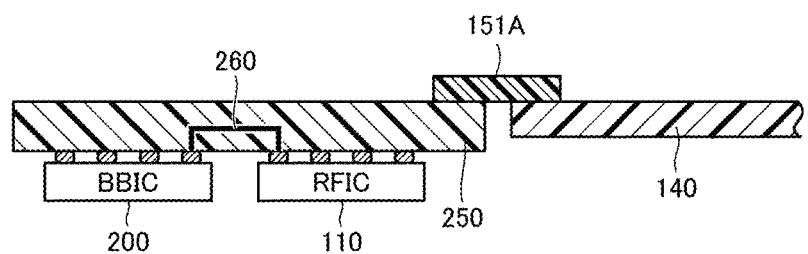
FIG. 11 is a view illustrating a first modification of a connection terminal.

For example, in connecting the motherboard 250 and the connection member 140, as illustrated in FIG. 11, the end portion of the motherboard 250 and the end portion of the connection member 140 may be arranged so as to face each other, and the respective front surfaces (or back surfaces) of the motherboard 250 and the connection member 140 may be connected to each other by a connection terminal 151A. Note that as illustrated in FIG. 12, the connection terminal 151A may be a combination of a plurality of connectors 151A1 and 151A2 each having a conductive pin and/or a socket.

Figure 13:
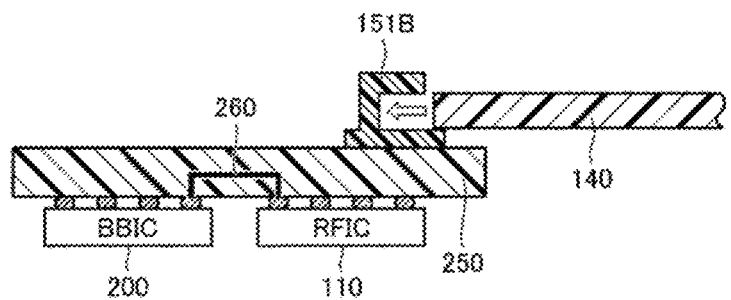
FIG. 13 is a view illustrating a second modification of the connection terminal.

Alternatively, as illustrated in FIG. 13, a terminal portion may be formed at the end portion of the connection member 140, and the connection member 140 may be fitted and connected to a connection terminal 151B mounted on a surface of the motherboard 250.

Figure 12:
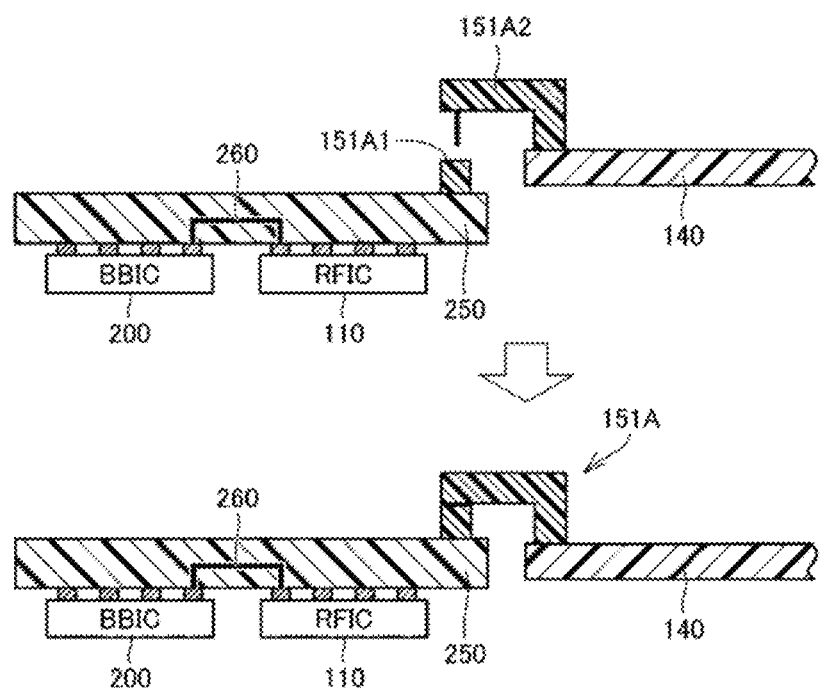
FIG. 12 is a view illustrating an example of the connection terminal in FIG. 11.

Note that the connection modes of FIG. 11 to FIG. 13 can also be applied to the connection between the connection member 140 and the antenna device 120.

Embodiment 4

(Configuration of Communication Device)

In Embodiment 4, an example of a case of a so-called dual-band type antenna module capable of radiating radio waves in two different frequency bands from an antenna device will be described.

Figure 14:
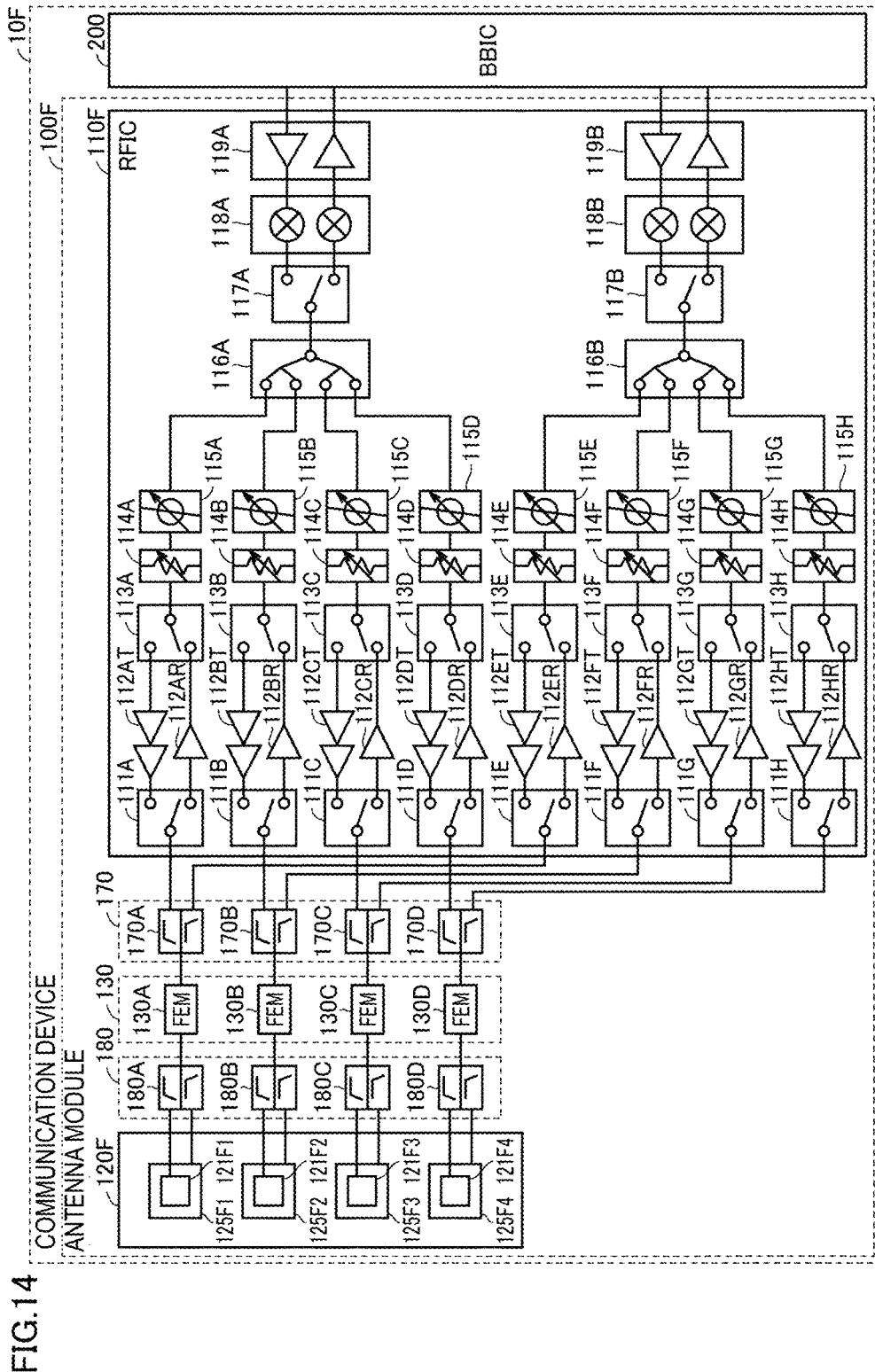
FIG. 14 is a block diagram of a communication device to which an antenna module according to Embodiment 4 is applied.

FIG. 14 is a block diagram of a communication device 10F to which an antenna module 100F according to Embodiment 4 is applied. Referring to FIG. 14, the communication device 10F includes the antenna module 100F and the BBIC 200. The antenna module 100F includes an RFIC 110F, an antenna device 120F, the FEM 130, and filter devices 170 and 180.

The antenna device 120F is a dual-band type antenna device as described above, and each of the radiating elements arranged in the antenna device 120F includes two feed elements 121F and 125F. Radio frequency signals are individually supplied from the RFIC 110F to the feed elements 121F and 125F. Note that in Embodiment 4, the "feed element 121F" and the "feed element 125F" correspond to a "first element" and a "second element", respectively, in the present disclosure.

The RFIC 110F includes the switches 111A to 111D and 113A to 113D, switches 111E to 111H, 113E to 113H, 117A, and 117B, the power amplifiers 112AT to 112DT, power amplifiers 112ET to 112HT, the low noise amplifiers 112AR to 112DR, low noise amplifiers 112ER to 112HR, the attenuators 114A to 114D, attenuators 114E to 114H, the phase shifters 115A to 115D, phase shifters 115E to 115H, signal combiners/splitters 116A and 116B, mixers 118A and 118B, and amplifier circuits 119A and 119B.

Among them, the configurations of the switches 111A to 111D, 113A to 113D, and 117A, the power amplifiers 112AT to 112DT, the low noise amplifiers 112AR to 112DR, the attenuators 114A to 114D, the phase shifters 115A to 115D, the signal combiner/splitter 116A, the mixer 118A, and the amplifier circuit 119A are a circuit for the high-frequency-side feed element 121F. In addition, the configurations of the switches 111E to 111H, 113E to 113H, and 117B, the power amplifiers 112ET to 112HT, the low noise amplifiers 112ER to 112HR, the attenuators 114E to 114H, the phase shifters 115E to 115H, the signal combiner/splitter 116B, the mixer 118B, and the amplifier circuit 119B are a circuit for the low-frequency-side feed element 125F.

In the case of transmitting a radio frequency signal, the switches 111A to 111H and 113A to 113H are switched to the power amplifiers 112AT to 112HT side, and the switches 117A and 117B are connected to the transmission-side amplifiers of the amplifier circuits 119A and 119B. In the case of receiving a radio frequency signal, the switches 111A to 111H and 113A to 113H are switched to the low noise amplifiers 112AR to 112HR side, and the switches 117A and 117B are connected to the reception-side amplifiers of the amplifier circuits 119A and 119B.

The filter device 170 (first filter device) includes diplexers 170A to 170D. In addition, the filter device 180 (second filter device) includes diplexers 180A to 180D. Each diplexer includes a high pass filter (first filter) that passes a radio frequency signal in a high frequency band (first frequency band) and a low pass filter (second filter) that passes a radio frequency signal in a low frequency band (second frequency band).

The high pass filters in the diplexers 170A to 170D are connected to the switches 111A to 111D in the RFIC 110F, respectively. In addition, the low pass filters in the diplexers 170A to 170D are connected to the switches 111E to 111H in the RFIC 110F, respectively. The diplexers 170A to 170D are connected to FEMs 130A to 130D, respectively. In addition, the FEMs 130A to 130D are connected to the diplexers 180A to 180D, respectively.

The high pass filters in the diplexers 180A to 180D are connected to feed elements 121F1 to 121F4 in the antenna device 120F, respectively. The low pass filters in the diplexers 180A to 180D are connected to feed elements 125F1 to 125F4 in the antenna device 120F, respectively.

As described above, the path for transmitting the radio frequency signal to the radiating elements each including the feed element 121F and the feed element 125F is made common between the filter device 170 and the filter device 180.

(Configuration of Antenna Module)

Figure 15:
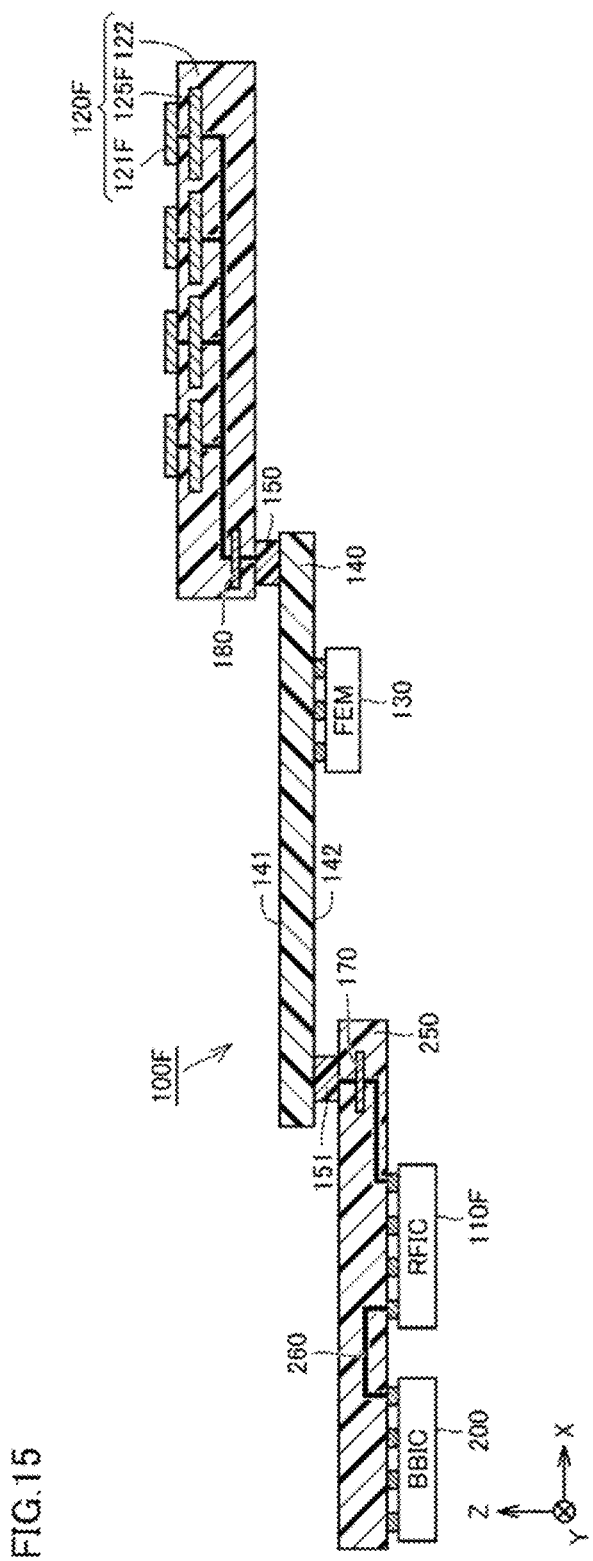
FIG. 15 is a side view of the antenna module according to Embodiment 4.
Figure 16:
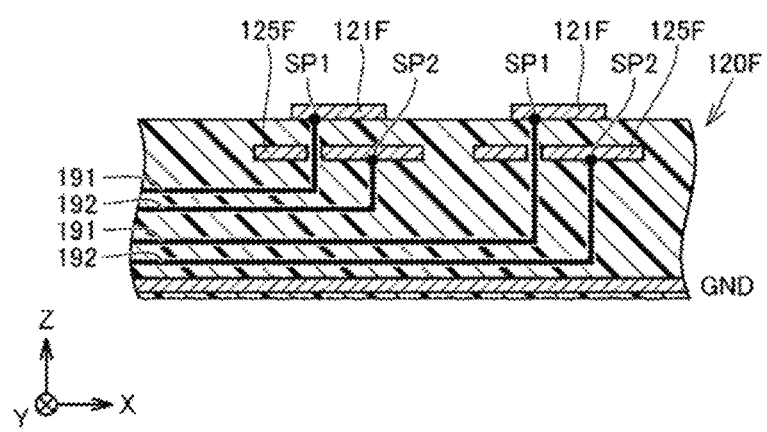
FIG. 16 is a partial cross-sectional view of an antenna device.
Figure 17:
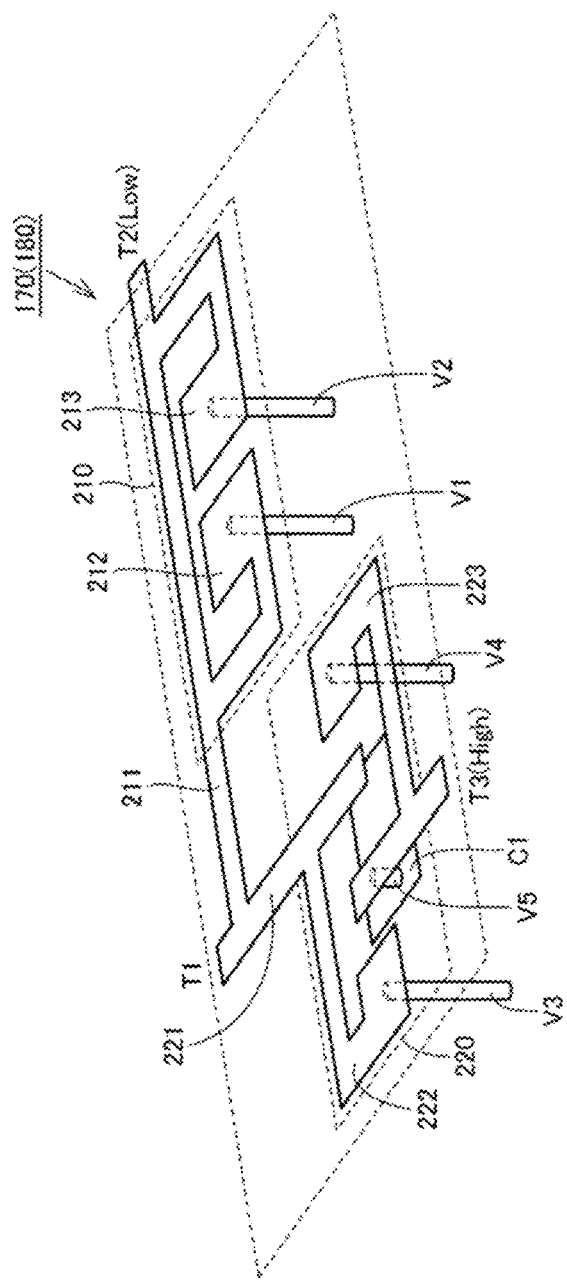
FIG. 17 is a view for explaining a configuration of a diplexer.

Next, a detailed configuration of the antenna module 100F according to Embodiment 4 will be described with reference to FIG. 15 to FIG. 17. FIG. 15 is a side view of the antenna module 100F. FIG. 16 is a partial cross-sectional view of the antenna device 120F. FIG. 17 is a view for explaining an example of a configuration of a diplexer.

In FIG. 15, the antenna device 120 in the antenna module 100 described above with reference to FIG. 3 is replaced with the antenna device 120F, and the RFIC 110 is replaced with the RFIC 110F. In addition, in FIG. 15, the filter device 170 is newly provided in the motherboard 250, and the filter device 180 is newly provided in the antenna device 120F. In FIG. 15, description of elements overlapping FIG. 3 will not be repeated. Note that although the BBIC 200 is mounted on the motherboard 250 in FIG. 15, the BBIC 200 may be formed on another substrate (not illustrated).

With reference to FIG. 15 to FIG. 17, the antenna device 120F is configured so that radio waves in two different frequency bands are possible as described above. The antenna device 120F includes the feed element 121F and the feed element 125F. The feed element 121F and feed element 125F are arranged to overlap each other when the dielectric substrate 122 is viewed in a plan view from the normal direction, and the feed element 125F is disposed between the feed element 121F and the ground electrode GND.

The size of the feed element 121F is smaller than the size of the feed element 125F. Therefore, radio waves are radiated from the feed element 121F in a higher frequency band than that of the feed element 125F. A radio frequency signal from the RFIC 110F is individually supplied to each of the feed element 121F and the feed element 125F. More specifically, as illustrated in FIG. 16, a radio frequency signal on the high-frequency side (for example, 39 GHz band) is supplied to the feed element 121F by a feed wiring 191, and a radio frequency signal on the low-frequency side (for example, 28 GHz band) is supplied to the feed element 125F by a feed wiring 192. The feed wiring 191 penetrates the feed element 125F and is connected to a feed point SP1 of the feed element 121F. The feed wiring 192 is connected to a feed point SP2 of the feed element 125F.

As illustrated in FIG. 17, the filter devices 170 and 180 are configured to include a plate-shaped electrode and a via. More specifically, the filter devices 170 and 180 include a terminal T1 to which the feed wiring made common is connected, a terminal T2 to which a low-frequency-side feed wiring is connected, and a terminal T3 to which a high-frequency-side feed wiring is connected. A low pass filter 210 is formed between the terminal T1 and the terminal T2, and a high pass filter 220 is formed between the terminal T1 and the terminal T3.

The low pass filter 210 includes a linear plate electrode 211 connected to the terminal T1 and the terminal T2, and plate electrodes 212 and 213 branched from the plate electrode 211 and arranged to face each other with a predetermined gap therebetween. The plate electrode 212 and the plate electrode 213 are arranged in line symmetry when viewed in a plan view from the normal direction of the substrate, and are electromagnetically coupled to each other. End portions of the plate electrode 212 and the plate electrode 213 are connected to the ground electrode GND by a via V1 and a via V2, respectively. In other words, the low pass filter 210 constitutes an LC series resonance circuit of a so-called n-type circuit including a series inductor (plate electrode 211) formed between the terminal T1 and the terminal T2, and two shunt stubs (plate electrodes 212, 213+vias V1, V2) branched from the inductor.

The high pass filter 220 includes a linear plate electrode 221 whose one end is connected to the terminal T1, plate electrodes 222 and 223, and a capacitor electrode C1. The plate electrode 222 is branched from the plate electrode 221, and an end portion thereof is connected to the ground electrode GND by a via V3. The other end of the plate electrode 221 is opposed to the capacitor electrode C1 disposed in a different layer. The plate electrode 221 and the capacitor electrode C1 form a capacitor. One end of the plate electrode 223 is connected to the ground electrode GND through a via V4, and the other end thereof is connected to the capacitor electrode C1 through a via V5. In addition, the plate electrode 223 is also connected to the terminal T3. In other words, the high pass filter 220 constitutes an LC series resonance circuit of a so-called 7t-type circuit including a series capacitor (plate electrode 221, capacitor electrode C1) formed between the terminal T1 and the terminal T3 and two shunt stubs (plate electrodes 222, 223+vias V3, V4) respectively branched from both ends of the capacitor.

Note that the low pass filter 210 and the high pass filter 220 may be arranged in the same layer as illustrated in FIG. 17, or may be arranged in different layers so as to partially overlap each other when viewed in a plan view from the normal direction of the substrate on which the filter device is formed. Under a condition the low pass filter 210 and the high pass filter 220 are formed in different layers, the ground electrode GND is disposed in a layer between the low pass filter 210 and the high pass filter 220 in order to prevent mutual coupling.

The filter device 170 is formed inside the motherboard 250. Further, the filter device 180 is formed inside the dielectric substrate 122 of the antenna device 120F.

Two radio frequency signals of different frequency bands individually output from the RFIC 110F are transmitted to the feed wiring made common via the filter device 170. The feed wiring made common extends to the antenna device 120F via the connection terminal 151, the connection member 140, and the connection terminal 150.

The feed wiring made common is branched into a high-frequency-side path and a low-frequency-side path by the filter device 180 formed in the antenna device 120F. The high-frequency-side path is connected to the feed element 121F, and the low-frequency-side path is connected to the feed element 125F.

In the case of a dual-band type antenna module in which power is individually supplied to each feed element, basically, the same number of feed wirings as the number of feed elements are required from the RFIC to the feed elements. In particular, in a case of a so-called dual polarization type antenna device capable of radiating radio waves in two different polarization directions from each feed element, twice as many feed wirings as the number of feed elements are required. For example, as illustrated in FIG. 14 and FIG. 15, under a condition four feed elements are provided for each frequency band (the total number of feed elements is eight), 16 feed wirings are required in the case of a dual polarization type antenna device. In this case, it is necessary to increase the width or thickness of the connection member, which may make it difficult to arrange the connection member in the device or may make it impossible to ensure the flexibility of the connection member. In addition, also since the connection terminals 150 and 151 require the same number of terminals as the number of feed wirings arranged in the connection member, the connector size increases, and the arrangement area of the connector in the motherboard and the antenna device increases.

On the other hand, in the antenna module 100F according to Embodiment 4, the filter devices (diplexer) 170 and 180 are arranged in the motherboard 250 and the antenna device 120F, respectively, so that the feed wiring is partially made common and the total number of feed wirings arranged in the connection member 140 can be reduced. This makes it possible to reduce the size (width and thickness) of the connection member 140 and to reduce the mounting areas on the motherboard 250 and the antenna device 120F. In addition, the number of terminals of the FEM arranged in the connection member 140 can also be reduced.

Figure 18:
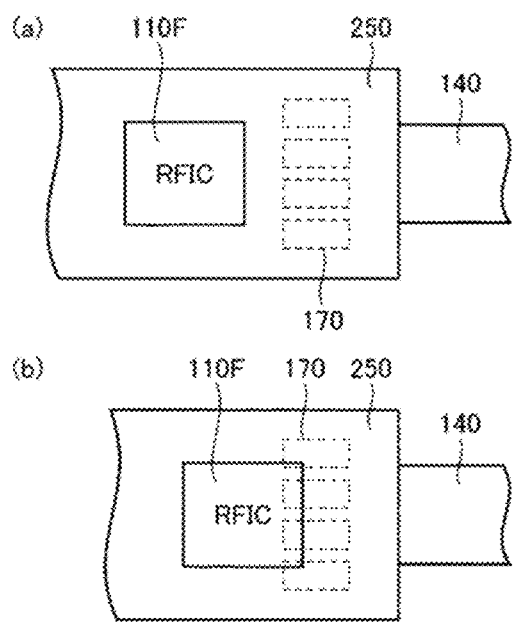
FIG. 18 includes views illustrating an arrangement example of a filter device on a motherboard.

Next, an arrangement example of the filter device on the motherboard 250 and the antenna device 120F will be described. FIG. 18 includes views illustrating an arrangement example of the filter device 170 on the motherboard 250. In addition, FIG. 19 includes views illustrating an arrangement example of the filter device 180 in the antenna device 120F.

Referring to FIG. 18, since each diplexer included in the filter device 170 is connected to the RFIC 110F and the feed wiring in the connection member 140 as described above, the filter device 170 is disposed between the RFIC 110F and the connection terminal 151 connecting the connection member 140 when the motherboard 250 is viewed in a plan view (FIG. 18(a)).

Note that the RFIC 110 and the connection member 140 are mounted on an outer surface of the motherboard 250, and the filter device 170 is formed inside the motherboard 250. Therefore, the filter device 170 may be disposed at a position partially overlapping the RFIC 110F and/or the connection member 140 when the motherboard 250 is viewed in a plan view as illustrated in FIG. 18(b). In addition, when the filter device 170 is formed as a chip component, the filter device 170 may be disposed on the outer surface of the motherboard 250.

Figure 19:
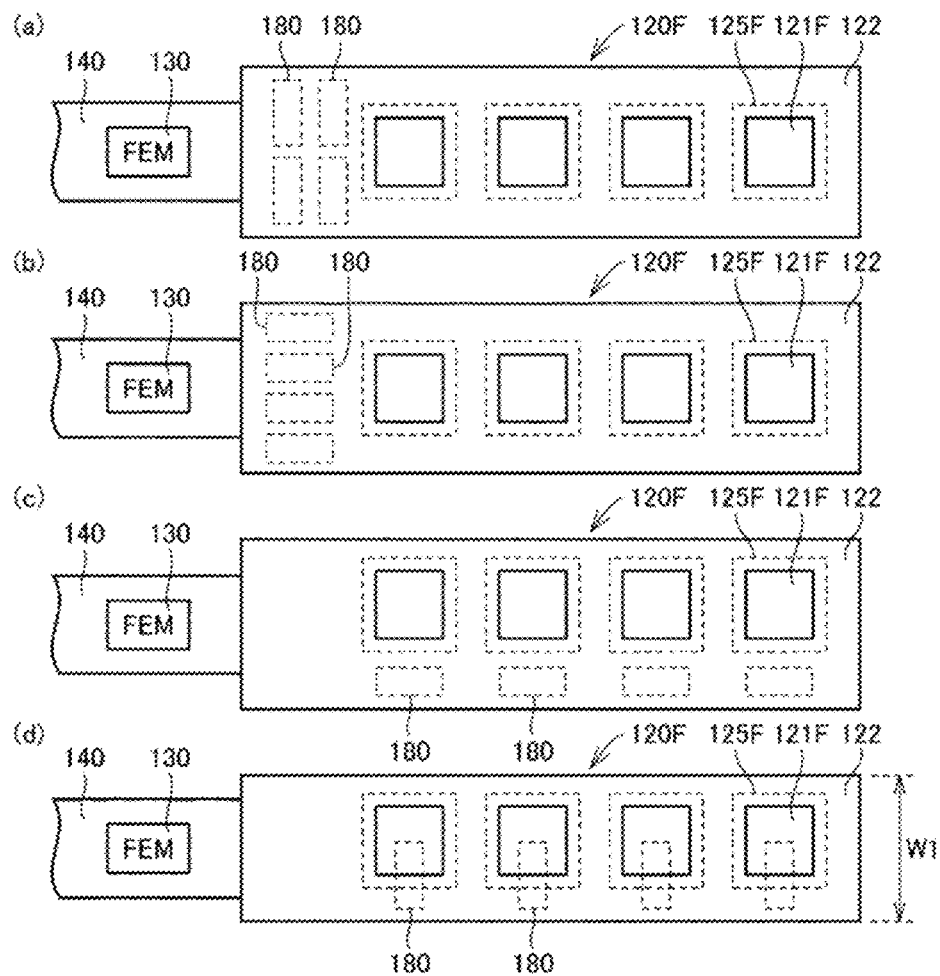
FIG. 19 includes views illustrating an arrangement example of a filter device in the antenna device.

Referring to FIG. 19, each diplexer included in the filter device 180 is disposed on the path connecting the connection terminal 150 and each of the feed elements in the antenna device 120F. FIGS. 19(a) and 19(b) illustrate an example in which the filter device 180 is disposed in a space between an end portion of the dielectric substrate 122 to which the connection member 140 is connected and a radiating element closest to the end portion. In FIG. 19(a), the diplexers are arranged in two rows so that a longitudinal direction of the outer shape of each diplexer is oriented in a direction orthogonal to an array direction of the radiating elements. In FIG. 19(b), the diplexers are arranged so that the longitudinal direction of the outer shape of each diplexer is oriented in the array direction of the radiating elements. In the case of such an arrangement, although the size of the dielectric substrate 122 in the array direction of the radiating elements is slightly increased, there is no increase in the size in the thickness direction as in the example of FIG. 19(d) to be described later, and therefore this arrangement is suitable for the case where the height is reduced.

FIG. 19(c) illustrates an arrangement example in which each diplexer is arranged side by side with the corresponding radiating element in a direction orthogonal to the array direction of the radiating elements. In the case of this arrangement example, since a space in the vicinity of the connection with the connection member 140 can be secured in the dielectric substrate 122, it is easy to design the wiring layout in the dielectric substrate 122. In addition, since power can be supplied to the vicinity of each of the radiating elements by the feed wiring made common, the number of feed wirings in the antenna device 120F can be reduced. Also in this case, when the dielectric substrate 122 is viewed in a plan view, the radiating element and the diplexer do not overlap each other, which is suitable for the case where the height is reduced.

In an arrangement example of FIG. 19(d), the diplexer is disposed in the vicinity of each radiating element as in FIG. 19(c), but the diplexer is disposed so as to partially overlap the corresponding radiating element when the dielectric substrate 122 is viewed in a plan view. In other words, the diplexer is disposed in the layer under the radiating element in the dielectric substrate 122. In the case of such an arrangement, although there is a possibility that the dimension of the dielectric substrate 122 in the thickness direction increases, a dimension W1 of the dielectric substrate 122 in the width direction (a direction orthogonal to the array direction of the radiating elements) can be reduced, which is suitable for reducing the size of the antenna device 120F.

As described above, in the dual-band type antenna module capable of radiating radio waves in two different frequency bands, the diplexers are arranged in front of and behind the connection member, so that the number of feed wirings arranged in the connection member can be reduced. As a result, in the antenna module, it is possible to suppress an increase in size due to an increase in the number of wirings.

Note that even in the case of radiating radio waves in one frequency band, by using the filter device as described above for a dual polarization type antenna module capable of radiating radio waves in two different polarization directions, it is possible to reduce the number of feed wirings arranged in the connection member.

In addition, in the antenna device 120F described above, the configuration in which the feed element 121F and the feed element 125F are arranged so as to overlap each other when viewed in a plan view from the normal direction of the dielectric substrate 122 has been described, but the feed element 121F and the feed element 125F may be arranged so as not to overlap each other.

(Modification 4)

In Embodiment 4, an example in which a diplexer is used has been described as a configuration in which individual power feeding is performed to a radiating element in a dual-band type antenna module.

In Modification 4, an example in which a diplexer is used in a dual-band type antenna module using a feed element and a parasitic element as radiating elements will be described.

Figure 20:
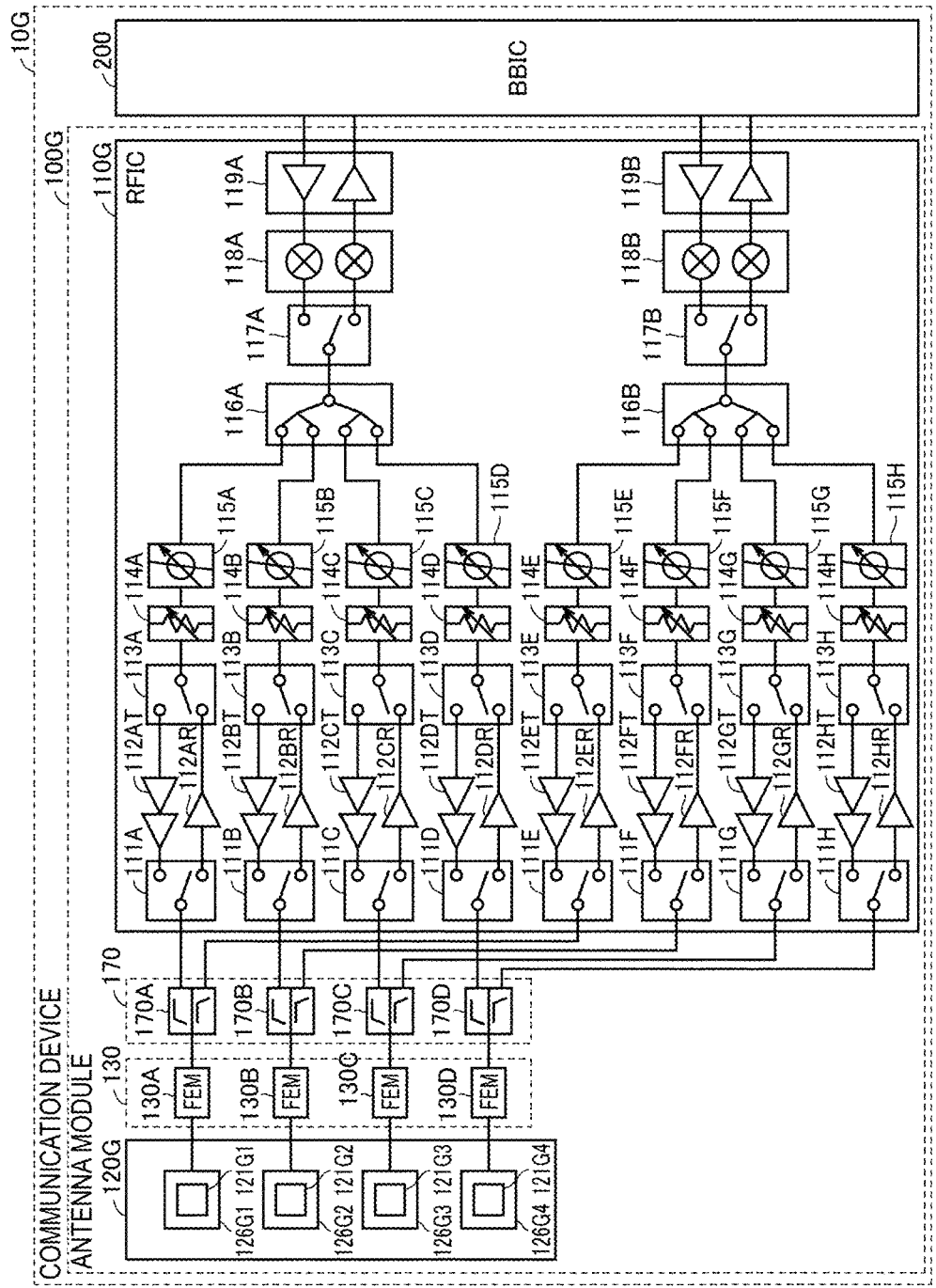
FIG. 20 is a block diagram of a communication device to which an antenna module according to Modification 4 is applied.

FIG. 20 is a block diagram of a communication device 10G to which an antenna module 100G according to Modification 4 is applied. Referring to FIG. 20, the communication device 10G includes the antenna module 100G and the BBIC 200. The antenna module 100G includes an RFIC 110G, an antenna device 120G, the FEM 130, and the filter device 170. Similar to the antenna module 100F of Embodiment 4, the FEM 130 is disposed on the connection member 140, and the filter device 170 is disposed on the motherboard 250. Note that since a configuration of the RFIC 110G is the same as the configuration of the RFIC 110F of Embodiment 4, detailed description thereof will not be repeated.

The antenna device 120G is a dual-band type antenna device similar to the antenna device 120F, but includes a feed element 121G and a parasitic element 126G as respective radiating elements. As illustrated in the partial cross-sectional view of the antenna device 120G in FIG. 21, the parasitic element 126G is disposed between the feed element 121G and the ground electrode GND in the antenna device 120G. Note that in Modification 4, the "feed element 121G"

and the "parasitic element 126G" correspond to the "first element" and the "second element", respectively, in the present disclosure.

Figure 21:
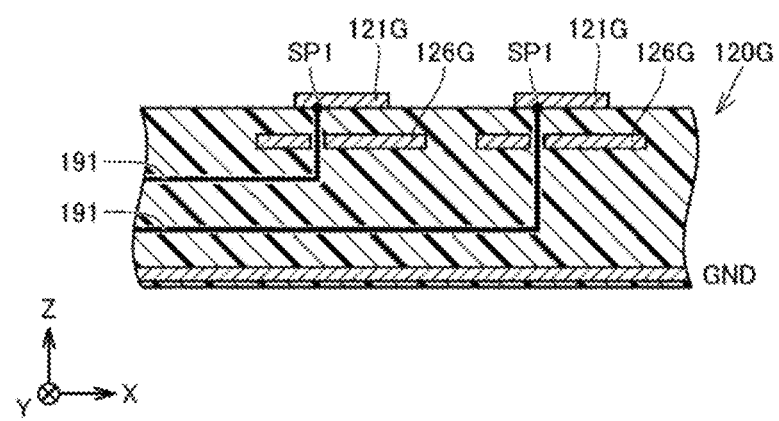
FIG. 21 is a cross-sectional view for explaining a connection state of a feed wiring in an antenna device.

As illustrated in FIG. 21, the feed wiring 191 penetrates the parasitic element 126G and is connected to the feed point SP1 of the feed element 121G. When a radio frequency signal on the high-frequency side corresponding to the feed element 121G (for example, 39 GHz band) is supplied to the feed wiring 191, radio waves are radiated from the feed element 121G. On the other hand, when a radio frequency signal on the low-frequency side corresponding to the parasitic element 126G (for example, 28 GHz band) is supplied to the feed wiring 191, the radio frequency signal is transmitted to the parasitic element 126G in a non-contact manner by electromagnetic field coupling between the feed wiring 191 and the parasitic element 126G in the penetrating portion of the feed wiring 191. Thus, radio waves are radiated from the parasitic element 126G.

Thus, also in the dual-band type antenna module using the feed element 121G and the parasitic element 126G, since radio frequency signals in respective frequency bands are individually output from the RFIC 110G, when these signals are transmitted to the antenna device 120G using individual feed wirings, it is necessary to arrange the same number of feed wirings as the number of radiating elements in the connection member 140. However, in the antenna module 100G according to Modification 4, the filter device 170 including the diplexer is provided on the motherboard 250, and the feed wiring for transmitting the radio frequency signal on the high-frequency side and the feed wiring for transmitting the radio frequency signal on the low-frequency side are made common, whereby the number of feed wirings arranged in the connection member 140 can be reduced. As a result, in the antenna module, it is possible to suppress an increase in size due to an increase in the number of wirings.

Note that although the configuration in which the filter device including the diplexer is used for the dual-band type antenna module has been described in Embodiment 4 and Modification 4, it is possible to reduce the number of feed wirings arranged in the connection member by using the filter device including a triplexer or a multiplexer even in an antenna module capable of radiating radio waves in three or more different frequency bands.

It should be understood that the embodiments disclosed herein are illustrative in all respects and are not restrictive. The scope of the present disclosure is defined not by the above description of the embodiments but by the claims, and is intended to include all changes within the meaning and scope equivalent to the claims.

REFERENCE SIGNS LIST

10, 10F, 10G COMMUNICATION DEVICE, 30 HOUSING, 50 HEAT INSULATING MEMBER, 100, 100A to 100G ANTENNA MODULE, 110, 110F, 110G RFIC, 111A to 111H, 113A to 113H, 117, 117A, 117B, 131, 132 SWITCH, 112AR to 112HR, 134 LOW NOISE AMPLIFIER, 112AT to 112HT, 133 POWER AMPLIFIER, 114A to 114H ATTENUATOR, 115A to 115H PHASE SHIFTER, 116, 116A, 116B SIGNAL COMBINER/SPLITTER, 118, 118A, 118B MIXER, 119, 119A, 119B AMPLIFIER CIRCUIT, 120, 120F ANTENNA DEVICE, 121, 121F1 to 121F4, 121G, 121G1 to 121G4, 125F, 125F1 to 125F4 FEED ELEMENT, 122, 143 DIELECTRIC SUBSTRATE, 126G, 126G1 to 126G4 PARASITIC ELEMENT, 130, 130A to 130D FEM, 140, 140A to 140D CONNECTION MEMBER, 141 FRONT SURFACE, 142 BACK SURFACE, 145 to 147 BENT PORTION, 150, 151, 151A, 151B CONNECTION TERMINAL, 151A1 to 151A4 CONNECTOR, 161, 162, 191, 192 FEED WIRING, 170, 180 FILTER DEVICE, 170A to 170D, 180A to 180D DIPLEXER, 200 BBIC, 210 LOW PASS FILTER, 220 HIGH PASS FILTER, 211 to 213, 221 to 223 PLATE ELECTRODE, 250 MOTHERBOARD, 260 CONNECTION WIRING, C1 CAPACITOR ELECTRODE, GND GROUND ELECTRODE, SP1, SP2 FEED POINT, T1 to T3 TERMINAL, V1 to V5 VIA

The invention claimed is:

1. An antenna module comprising:
    a first substrate on which a radiating element is disposed;
    a second substrate on which a feed circuit that supplies a radio frequency signal to the radiating element is disposed;
    a connection member that interconnects the first substrate and the second substrate and conveys a radio frequency signal between the feed circuit and the radiating element; and
    an amplifier circuit disposed on the connection member and configured to amplify the radio frequency signal transmitted between the feed circuit and the radiating element,
    wherein the amplifier circuit is disposed at a position between a connecting point with the first substrate and a connecting point with the second substrate on the connection member.

2. The antenna module according to claim 1, wherein the position is closer to the first substrate than to the second substrate in a signal transmission path in the connection member.

3. The antenna module according to claim 1, wherein the position is closer to the second substrate than to the first substrate in a signal transmission path in the connection member.

4. The antenna module according to claim 1, wherein the amplifier circuit is included in a discrete electronic component that is in contact with the second substrate.

5. The antenna module according to claim 4,
    wherein an end portion of the connection member and an end portion of the second substrate overlap each other as viewed in a plan view from a normal direction of the second substrate, and
    the amplifier circuit is in contact with the second substrate on a surface opposite to a surface of the amplifier circuit mounted on the connection member.

6. The antenna module according to claim 5, wherein the amplifier circuit is disposed on a surface of the connection member that is opposite to a surface to which the first substrate is connected.

7. The antenna module according to claim 6, further comprising:
    a first connection terminal that connects the first substrate and the connection member; and
    a second connection terminal that connects the second substrate and the connection member,
    wherein the amplifier circuit is disposed between the first connection terminal and the second connection terminal on a signal transmission path in the connection member.

8. The antenna module according to claim 7, wherein the amplifier circuit is disposed at a position that does not overlap the radiating element as viewed in a plan view from a normal direction of the first substrate.

9. The antenna module according to claim 8, wherein the connection member is flexible.

10. The antenna module according to claim 9,
wherein the connection member has at least one bent portion that extends from the first substrate to the second substrate, and
the position of the amplifier circuit is closer to the first substrate than the bent portion in a signal transmission path in the connection member.

11. The antenna module according to claim 10, wherein the connection member has a multilayer structure comprising a plurality of dielectric layers laminated on one another, and includes a first wiring and a second wiring formed in layers different from each other as portions of a signal transmission path.

12. The antenna module according to claim 11, wherein the connection member further includes a ground electrode disposed in a layer between a dielectric layer in which the first wiring is formed and another dielectric layer in which the second wiring is formed.

13. The antenna module according to claim 12,
wherein the amplifier circuit includes a first amplifier and a second amplifier,
the first amplifier is disposed on a first surface of the connection member and amplifies a second radio frequency signal conveyed via the first wiring, and
the second amplifier is disposed on a second surface of the connection member and amplifies a third radio frequency signal conveyed via the second wiring.

14. The antenna module according to claim 13, wherein the amplifier circuit includes at least one of a power amplifier that amplifies a transmission signal from the feed circuit and a low noise amplifier that amplifies a reception signal received by the radiating element.

15. The antenna module according to claim 1,
wherein the radiating element includes a first element capable of radiating radio waves in a first frequency band and a second element capable of radiating radio waves in a second frequency band different from the first frequency band,
the antenna module further includes a first filter device including a first filter configured to pass a signal in the first frequency band and a second filter configured to a signal in the second frequency band, and
the first filter device is disposed on a signal transmission path between the feed circuit and the connection member in the second substrate.

16. The antenna module according to claim 15 further comprising a second filter device including the first filter and the second filter,
wherein the second filter device is disposed on a signal transmission path between the radiating element and the connection member in the first substrate.

17. The antenna module according to claim 1, further comprising the feed circuit.

18. A communication device equipped with the antenna module according to claim 1.

19. The communication device according to claim 18 further comprising a housing sized to accommodate the antenna module; and a heat insulating member disposed between the amplifier circuit and the housing
wherein the amplifier circuit is separated from the housing.

20. A connector comprising:
a connection member configured to connect, in an antenna module, a first substrate on which a radiating element is disposed and a second substrate on which a feed circuit that supplies a radio frequency signal to the radiating element is disposed, the connection member including
a third substrate that contains therein a feed wiring that conveys a radio frequency signal between the feed circuit and the radiating element, and
an amplifier circuit disposed on the third substrate and configured to amplify the radio frequency signal transmitted between the feed circuit and the radiating element,
wherein the amplifier circuit is disposed at a position between a connecting point with the first substrate and a connecting point with the second substrate in the third substrate.

* * * * *